(12) United States Patent
Guzek et al.

(10) Patent No.: US 7,372,126 B2
(45) Date of Patent: May 13, 2008

(54) ORGANIC SUBSTRATES WITH EMBEDDED THIN-FILM CAPACITORS, METHODS OF MAKING SAME, AND SYSTEMS CONTAINING SAME

(75) Inventors: John S. Guzek, Chandler, AZ (US); Cengiz A. Palanduz, Chandler, AZ (US); Victor Prokofiev, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 11/096,235

(22) Filed: Mar. 31, 2005

(65) Prior Publication Data

US 2006/0220175 A1    Oct. 5, 2006

(51) Int. Cl.
*H01L 29/00* (2006.01)
(52) U.S. Cl. .............. 257/532; 257/535; 257/E27.048
(58) Field of Classification Search ............ 257/532, 257/535, 516, E27.048; 361/311, 313, 330, 361/321; 438/171, 210, 381, 393
See application file for complete search history.

(56) References Cited

U.S. PATENT DOCUMENTS

| | | | |
|---|---|---|---|
| 4,890,192 A | 12/1989 | Smith | |
| 5,745,334 A | 4/1998 | Hoffarth et al. | |
| 5,800,575 A | 9/1998 | Lucas | |
| 6,236,102 B1 | 5/2001 | Kim et al. | |
| 6,339,527 B1 | 1/2002 | Farooq et al. | |
| 6,368,514 B1 | 4/2002 | Metzler | |
| 6,433,993 B1 | 8/2002 | Hunt et al. | |
| 6,448,628 B2 | 9/2002 | Chern et al. | |
| 6,459,117 B1 | 10/2002 | Liou | |
| 6,477,036 B2 | 11/2002 | Kitagawa et al. | |
| 6,605,515 B2 | 8/2003 | Kitagawa et al. | |
| 6,739,027 B1 | 5/2004 | Lauffer et al. | |
| 6,749,928 B2 | 6/2004 | Takaya et al. | |
| 6,754,952 B2 | 6/2004 | Takano et al. | |
| 6,897,508 B2 | 5/2005 | Sneh | |
| 6,910,266 B2 | 6/2005 | Lee et al. | |
| 6,928,726 B2 | 8/2005 | Zollo et al. | |
| 7,027,289 B2 | 4/2006 | He et al. | |
| 7,288,459 B2 | 10/2007 | Guzek et al. | |
| 2001/0019144 A1 | 9/2001 | Roy | |
| 2004/0196620 A1 | 10/2004 | Knudsen et al. | |
| 2004/0257749 A1 | 12/2004 | Otsuka et al. | |
| 2005/0269128 A1 | 12/2005 | Usui et al. | |
| 2006/0143886 A1 | 7/2006 | Srinivasan et al. | |
| 2006/0223226 A1 | 10/2006 | Guzek et al. | |

OTHER PUBLICATIONS

"U.S. Appl. No. 11/095,917 Non-Final Office Action mailed Oct. 19, 2006", 5 pgs.

(Continued)

*Primary Examiner*—Thien F Tran
(74) *Attorney, Agent, or Firm*—Schwegman, Lundberg & Woessner, P.A.

(57) ABSTRACT

A thin-film capacitor assembly includes two plates that are accessed through deep and shallow vias. The thin-film capacitor assembly is able to be coupled with a spacer and an interposer. The thin-film capacitor assembly is also able to be stacked with a plurality of thin-film capacitor assemblies. The thin-film capacitor assembly is also part of computing system.

15 Claims, 7 Drawing Sheets

OTHER PUBLICATIONS

"U.S. Appl. No. 11/095,917 Notice of Allowance mailed Mar. 23, 2007", 5 pgs.

"U.S. Appl. No. 11/095,917 Notice of Allowance mailed Jun. 18, 2007", 5 pgs.

"U.S. Appl. No. 11/095,917 Response filed Jan. 31, 2007 in response to Non-Final Office Action mailed Oct. 19, 2006", 10 pgs.

US 7,372,126 B2

ORGANIC SUBSTRATES WITH EMBEDDED THIN-FILM CAPACITORS, METHODS OF MAKING SAME, AND SYSTEMS CONTAINING SAME

TECHNICAL FIELD

Disclosed embodiments relate to a plate capacitor assembly.

BACKGROUND INFORMATION

A microelectronic die often requires capacitative power sources to respond to transient loads generated during operation. Capacitors are provided to answer the transient load requirements of the die.

Power delivery is a significant concern in the design and operation of a microelectronic device. Where the microelectronic device is a processor or an application-specific integrated circuit (ASIC), an adequate current delivery, a steady voltage, and an acceptable processor transient response are desirable characteristics of the overall microelectronic device package. One of the methods for responding to a processor transient is to place a high-performance capacitor as close to the processor as possible to shorten the transient response time. Although a large-capacity and high-performance capacitor is preferable to answer the processor transients, the capacitor is in competition for space in the immediate vicinity of the processor.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "processor" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations. In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1A:
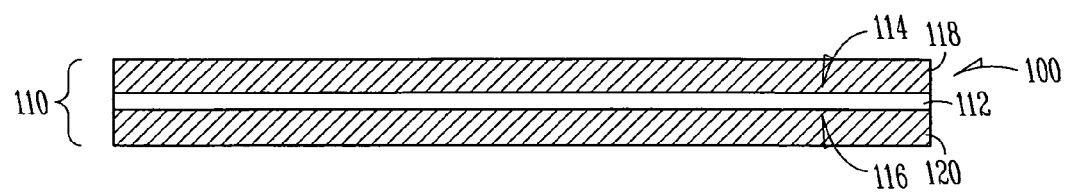
FIG. 1A is a cross-section elevation of a capacitor assembly during processing according to an embodiment.

FIG. 1A is a cross-section elevation of a capacitor assembly 100 during processing according to an embodiment. The capacitor assembly 100 includes a laminate 110. The laminate 110 includes a dielectric center film 112 with a first side 114 and a second side 116. In an embodiment, the laminate 110 includes a first plate 118. In an embodiment, the laminate 110 includes the first plate 118 on the first side 114 and a second plate 120 on the second side 116.

In an embodiment, the first plate 114 and the second plate 116 are made of copper, copper alloys, and the like. In an embodiment, the first plate 114 and the second plate 116 are made of nickel, nickel alloys, and the like. In an embodiment, the first plate 114 and the second plate 116 are made of platinum, platinum alloys, and the like. In an embodiment, the first plate 114 and the second plate 116 are made of palladium, palladium alloys, and the like.

In an embodiment, the dielectric center film 112 is made of a low-K inorganic material such as barium strontium titanate (BST). In an embodiment, the dielectric center film 112 is made of an organic material such as a resin. In an embodiment, the dielectric center film 112 is a thermosetting resin. In an embodiment, the dielectric center film 112 is a thermoplastic resin. In an embodiment, the dielectric center film 112 is a material such as a poly tetrafluoro ethylene (PTFE).

Figure 1B:
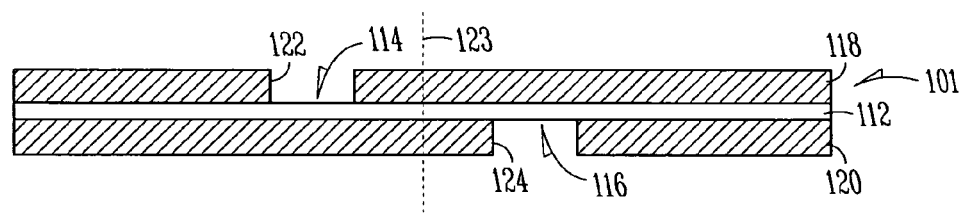
FIG. 1B is a cross-section of the capacitor assembly depicted in FIG. 1A during further processing according to an embodiment.

FIG. 1B is a cross-section of the capacitor assembly depicted in FIG. 1A during further processing according to an embodiment. The capacitor assembly 101 has been processed to achieve a first recess 122 in the first plate 118 that exposes the first side 114. In an embodiment, the capacitor assembly 101 has been processed to achieve the first recess 122 in the first plate 118 that exposes the first side 114, and a second recess 124 in the second plate 120 that exposes the second side 116. The first recess 122 and the second recess 124 are offset with respect to a symmetry line 123.

Figure 1C:
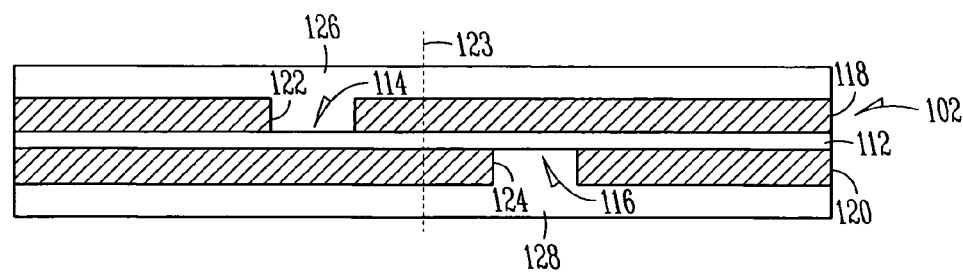
FIG. 1C is a cross-section of the capacitor assembly depicted in FIG. 1B during further processing according to an embodiment.

FIG. 1C is a cross-section of the capacitor assembly depicted in FIG. 1B during further processing according to an embodiment. The capacitor assembly 102 has been processed to achieve a first film 126 over the first plate 118. In an embodiment, the capacitor assembly 102 has been processed to achieve the first film 126 over the first plate 118 and a second film 128 over the second plate 120. In an embodiment, the first film 126 is a dielectric organic, such as any of the dielectric materials, and the like, that are used for the dielectric center film 112 as set forth herein.

Figure 1D:
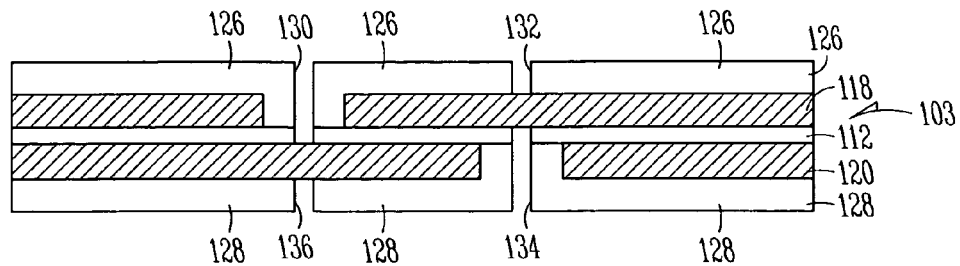
FIG. 1D is a cross-section of the capacitor assembly depicted in FIG. 1C during further processing according to an embodiment.

FIG. 1D is a cross-section of the capacitor assembly depicted in FIG. 1C during further processing according to an embodiment. The capacitor assembly 103 has been further processed to achieve a deep first via 130 in the first recess 122 that also exposes the second plate 120 at the bottom of the deep first via 130. In an embodiment, the capacitor assembly 103 has been further processed to achieve the deep first via 130 in the first recess and a shallow first via 132 in the first film 126 and that also exposes the first plate 118 at the bottom of the shallow first via 132. In an embodiment, the capacitor assembly 103 has been further processed to achieve a deep second via 134 in the second recess 124 that also exposes the first plate 118 at the bottom of the deep second via 132. In an embodiment, the capacitor assembly 103 has been further processed to achieve the deep second via 134 in the second recess 124 and a shallow second via 136 in the second film 128 and that also exposes the first plate 118 at the bottom of the shallow first via 132.

Figure 1E:
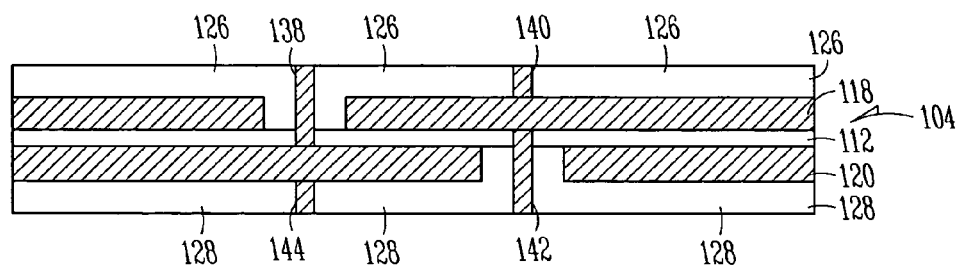
FIG. 1E is a cross-section of the capacitor assembly depicted in FIG. 1D during further processing according to an embodiment.

FIG. 1E is a cross-section of the capacitor assembly depicted in FIG. 1D during further processing according to an embodiment. The capacitor assembly 104 has been further processed to achieve a deep first contact 138 in the deep first via 130. In an embodiment, the capacitor assembly 104 has been further processed to achieve the deep first contact 138 in the deep first via 130, and a shallow first contact 140 in the shallow first via 132. In an embodiment, the capacitor assembly 104 has been further processed to achieve a deep second contact 142 in the deep second via 134. In an embodiment, the capacitor assembly 104 has been further processed to achieve the deep second contact 142 in the deep second via 134, and a shallow second contact 144 in the shallow second via 136.

Formation of the contacts can be done by electroplating. In an embodiment, the first plate 118 is connected as a cathode in an electroplating environment. In an embodiment, the first plate 118 and the second plate 120 are connected as cathodes in an electroplating environment.

Figure 1F:
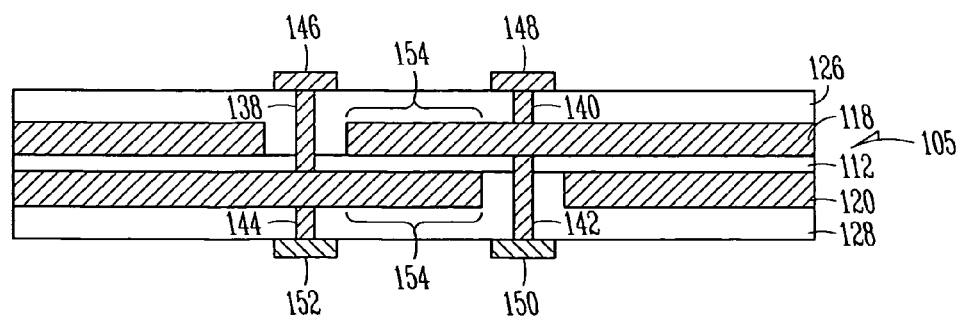
FIG. 1F is a cross-section of the capacitor assembly depicted in FIG. 1E during further processing according to an embodiment.

FIG. 1F is a cross-section of the capacitor assembly depicted in FIG. 1E during further processing according to an embodiment. The capacitor assembly 105 has been further processed to achieve an upper first terminal 146 at the deep first contact 138. In an embodiment, the capacitor assembly 105 has been further processed to achieve the upper first terminal 146 at the deep first contact 138 and an upper second terminal 148 at the shallow first contact 140. In an embodiment, the capacitor assembly 105 has been further processed to achieve a lower first terminal 150 at the deep second contact 142. In an embodiment, the capacitor assembly 105 has been further processed to achieve the lower first terminal 150 at the deep second contact 142 and a lower second contact 152 at the shallow second terminal 144.

As depicted in FIG. 1F, the capacitor assembly 105 includes a capacitor plate surface area 154 between a portion of the first plate 118 and the second plate 120, as induced by a potential that can be established through the upper first terminal 146 and the lower first terminal 150.

Formation of the terminals can be done by electroplating. In an embodiment, the top first terminal 146 is connected as a cathode in an electroplating environment. In an embodiment, the top first terminal 146 and the top second terminal 148 are connected as cathodes in an electroplating environment. In an embodiment, the bottom first electrode 150 and the bottom second electrode 152 are similarly formed.

Figure 1G:
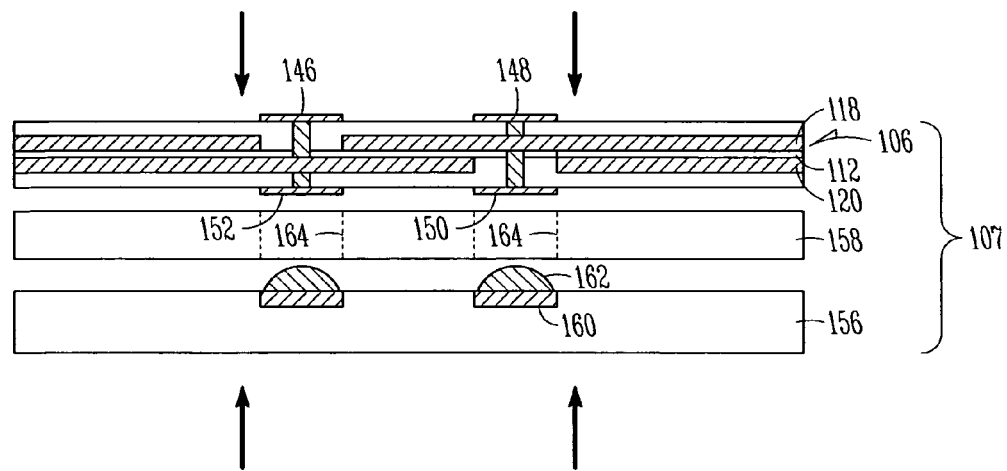
FIG. 1G is a cross-section of the capacitor assembly depicted in FIG. 1F during further processing according to an embodiment.

FIG. 1G is a cross-section of the capacitor assembly 106 depicted in FIG. 1F during further processing according to an embodiment. The capacitor assembly 107 is being further processed by bringing the capacitor assembly 106 together with a substrate 156. In an embodiment, the substrate 156 is part of a printed wiring board (PWB) such as a main board. In an embodiment, the substrate 156 is part of an interposer. In an embodiment, the substrate 156 is part of a mezzanine PWB. In an embodiment, the substrate 156 is part of an expansion card PWB. In an embodiment, the substrate 156 is part of a small PWB such as a board for a handheld device such as a cell phone or personal digital assistant (PDA).

The capacitor assembly 106 is depicted by the directional arrows as being brought together with the substrate 156. A polymer film 158 is placed between the capacitor assembly 106 and the substrate 156 during processing. In an embodiment, the polymer film 158 is a B-staged polymer that allows for penetration of rigid objects. FIG. 1G depicts a substrate bond pad 160 and a bump 162 disposed on the substrate bond pad 160. In an embodiment, the polymer film 158 is sufficiently pliant during processing such that the bump 162 penetrates the polymer film 158 and contacts the lower first terminal 150.

In an embodiment, the polymer film 158 has been pre-patterned with a film recess 164, which is depicted in phantom lines therein. Thereby, penetration of the bump 162 into the polymer film 158 is facilitated, to make contact with the bottom first terminal 150. In an embodiment, the bump 162 is a solder paste at the processing depicted in FIG. 1G.

Figure 1H:
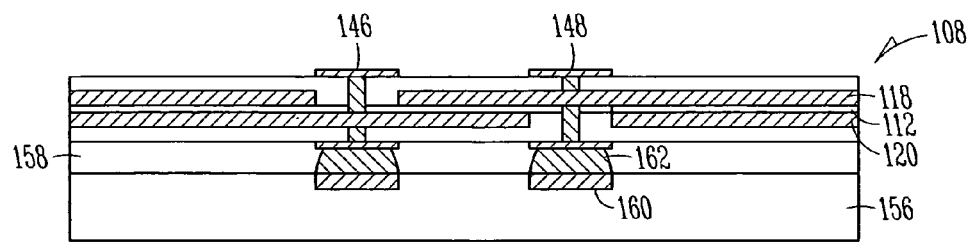
FIG. 1H is a cross-section of the capacitor assembly depicted in FIG. 1F during further processing according to an embodiment.

FIG. 1H is a cross-section of the capacitor assembly depicted in FIG. 1F during further processing according to an embodiment. The capacitor assembly 108 is being further processed heating and/or pressing the various structures. In an embodiment, the bump 162 is reflowed, followed by curing of the polymer film 158. In an embodiment, the polymer film 158 is cured, followed by reflowing of the bump 162. In an embodiment, curing of the polymer film 158 and reflowing of the bump 162 are carried out in a single heating tool. In an embodiment, curing of the polymer film 158 and reflowing of the bump 162 are carried out substantially simultaneously.

Figure 2:
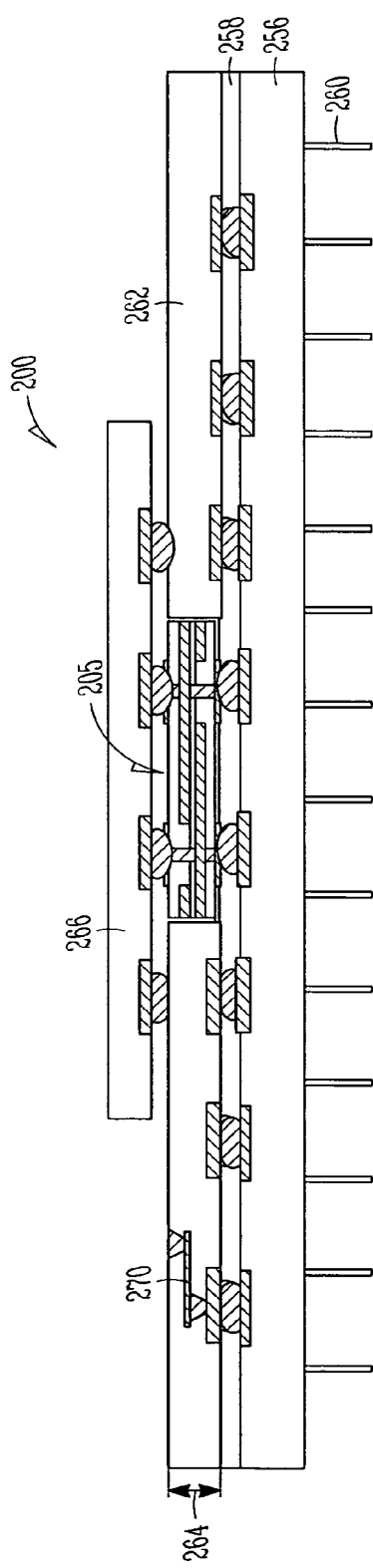
FIG. 2 is a cross-section elevation of a capacitor assembly package according to an embodiment.

FIG. 2 is a cross-section elevation of a capacitor composite 200 according to an embodiment. In an embodiment, the capacitor composite 200 includes a capacitor assembly 205 such as the capacitor assembly 105 depicted in FIG. 1F. The capacitor composite 200 includes a spacer 262. FIG. 2 illustrates a capacitor assembly profile 264, depicted as a height. The capacitor assembly profile 264 is substantially the same for the spacer 262 as it is for the capacitor assembly 205.

In an embodiment, formation of the spacer 262 includes molding the spacer 262. In an embodiment, pinning out of the spacer 262 is done by placing a trace in the mold chase and injection molding spacer material to form an encapsulated trace 270. Only one trace 270 is illustrated in FIG. 2 by way of non-limiting example.

In an embodiment, the capacitor composite 200 includes an interposer 256 and optionally a polymer film 258 disposed between the capacitor assembly 205 and the interposer 256. The interposer 256 is depicted with a plurality of pins, one of which is identified with the reference numeral 260.

Figure 3:
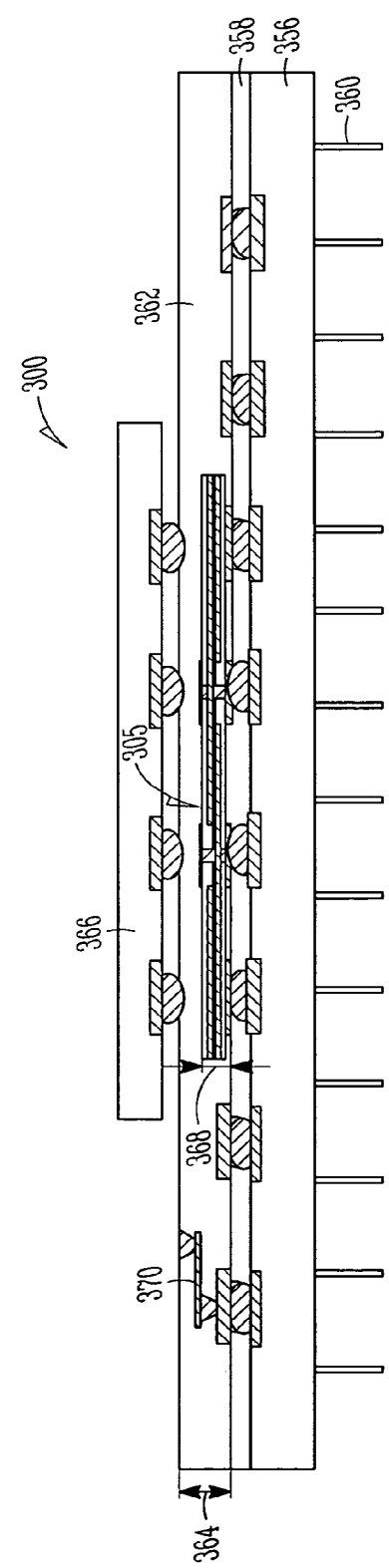
FIG. 3 is a cross-section elevation of a capacitor assembly package according to an embodiment.

FIG. 3 is a cross-section elevation of a capacitor composite 300 according to an embodiment. In an embodiment, the capacitor composite 300 includes a capacitor assembly 305 such as the capacitor assembly 105 depicted in FIG. 1F. The capacitor composite 300 includes a spacer 362. In an embodiment, the capacitor assembly is embedded in the spacer 362. FIG. 3 illustrates a capacitor composite profile 364, depicted as a height. Similarly, the capacitor assembly 305 has a capacitor assembly profile 368, also depicted as a height. The capacitor assembly profile 364 is greater than the capacitor assembly profile 368.

In an embodiment, formation of the capacitor composite 300 includes molding the spacer 362 after placing the capacitor assembly 305 in a mold chase. In an embodiment, pinning out of the spacer 362 is done by placing a trace in the mold chase and injection molding spacer material to form an encapsulated trace 370.

In an embodiment, the capacitor composite 300 includes an interposer 356 and optionally a polymer film 358 disposed between the capacitor assembly 305 and the interposer 356. The interposer 356 is depicted with a plurality of pins, one of which is identified with the reference numeral 360.

Figure 4:
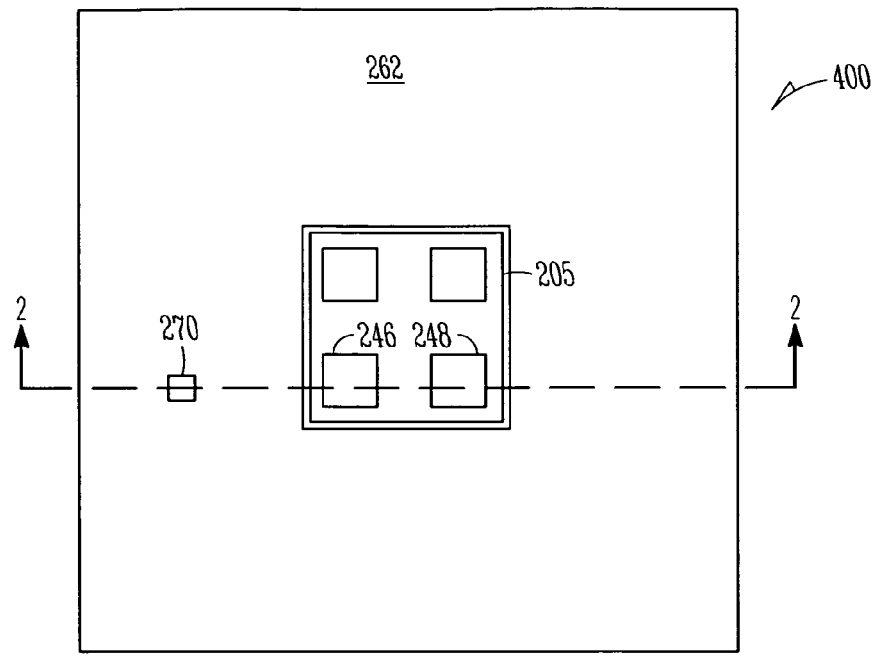
FIG. 4 is a plan detail of a portion of the capacitor composite depicted in FIG. 2 according to an embodiment.

FIG. 4 is a plan detail 400 of a portion of the capacitor composite 200 depicted in FIG. 2 according to an embodiment. The capacitor composite 200 depicted in FIG. 2 can be seen when viewed along the section line 2-2 in FIG. 4. The capacitor assembly 205 can be seen as well as the top first terminal 246 and the top second terminal 248. Similarly, a bond pad of the encapsulated trace 270 depicted in FIG. 2 is exposed by this view. The spacer 262 exhibits a central recess into which the capacitor assembly 205 has been located. In an embodiment, the capacitor assembly 205 has been located in the spacer 262 by overmolding technology. In an embodiment, the capacitor assembly 205 has been located in the spacer 262 by pick-and-place technology.

Figure 5:
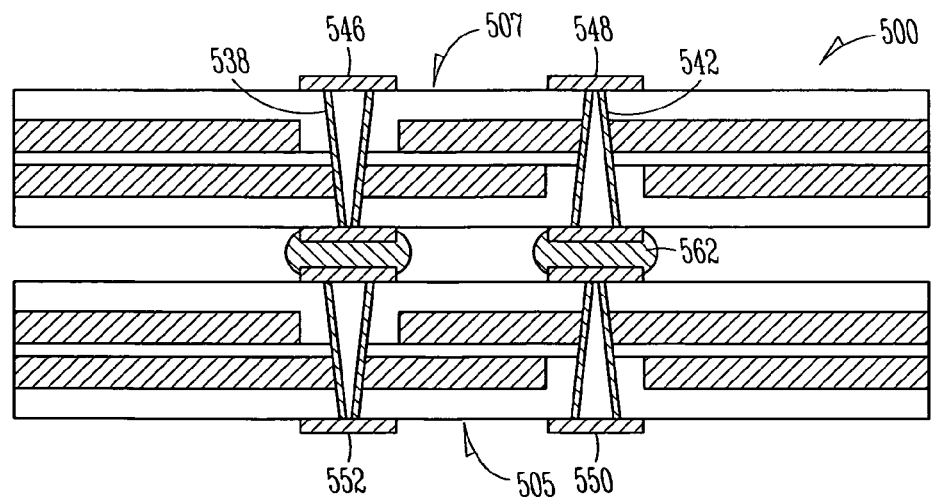
FIG. 5 is a cross-section elevation of a plurality of stacked capacitor assemblies according to an embodiment.

FIG. 5 is a cross-section elevation of a plurality of stacked capacitor assemblies 500 according to an embodiment. In an embodiment, a first capacitor assembly 505 is provided, such as the capacitor assembly 105 depicted in FIG. 1F. A subsequent capacitor assembly 507 is depicted, disposed above the first capacitor assembly 505. A bump 562 is used to couple the first capacitor assembly 505 and the subsequent capacitor assembly 507. In an embodiment, the bump 562 has an aspect ratio that is substantially the same as the terminals. In FIG. 5, a bottom first terminal 550 and a bottom second terminal 552 are depicted as part of the first capacitor assembly 505, and a top first terminal 546 and a top second terminal 548 are depicted as part of the subsequent capacitor assembly 507.

In an embodiment, a plurality of capacitor assemblies are combined as depicted in FIG. 5 to form a capacitor assembly embodiment. In an embodiment, a plurality of capacitor assemblies is prepared in a stack in a range from about 2 to about 50. In an embodiment, a plurality of capacitor assemblies is prepared in a stack in a range from about 3 to about 30. In an embodiment, a plurality of capacitor assemblies is prepared in a stack in a range from about 4 to about 20. In an embodiment, a plurality of capacitor assemblies is prepared in a stack in a range from about 5 to about 10.

In an embodiment, a single capacitor assembly, such as the capacitor assembly 505, includes a profile height in a range from about 1 micrometer (μm) to about 100 μm. In an embodiment, a single capacitor assembly includes a profile height in a range from about 2 μm to about 50 μm. In an embodiment, a single capacitor assembly includes a profile height in a range from about 3 μm to about 20 μm. In an embodiment, a single capacitor assembly includes a profile height in a range from about 4 μm to about 10 μm.

In an embodiment, a plurality of capacitor assemblies is prepared in a stack in a range from about 2 to about 50, and has a profile height in a range from about 1 μm to about 100 μm. In an embodiment, a plurality of capacitor assemblies is prepared in a stack in a range from about 3 to about 30, and has a profile height in a range from about 1 μm to about 50 μm. In an embodiment, a plurality of capacitor assemblies is prepared in a stack in a range from about 4 to about 20, and has a profile height in a range from about 1 μm to about 20 μm. In an embodiment, a plurality of capacitor assemblies is prepared in a stack in a range from about 5 to about 10, and has a profile height in a range from about 1 μm to about 10 μm.

Figure 6:
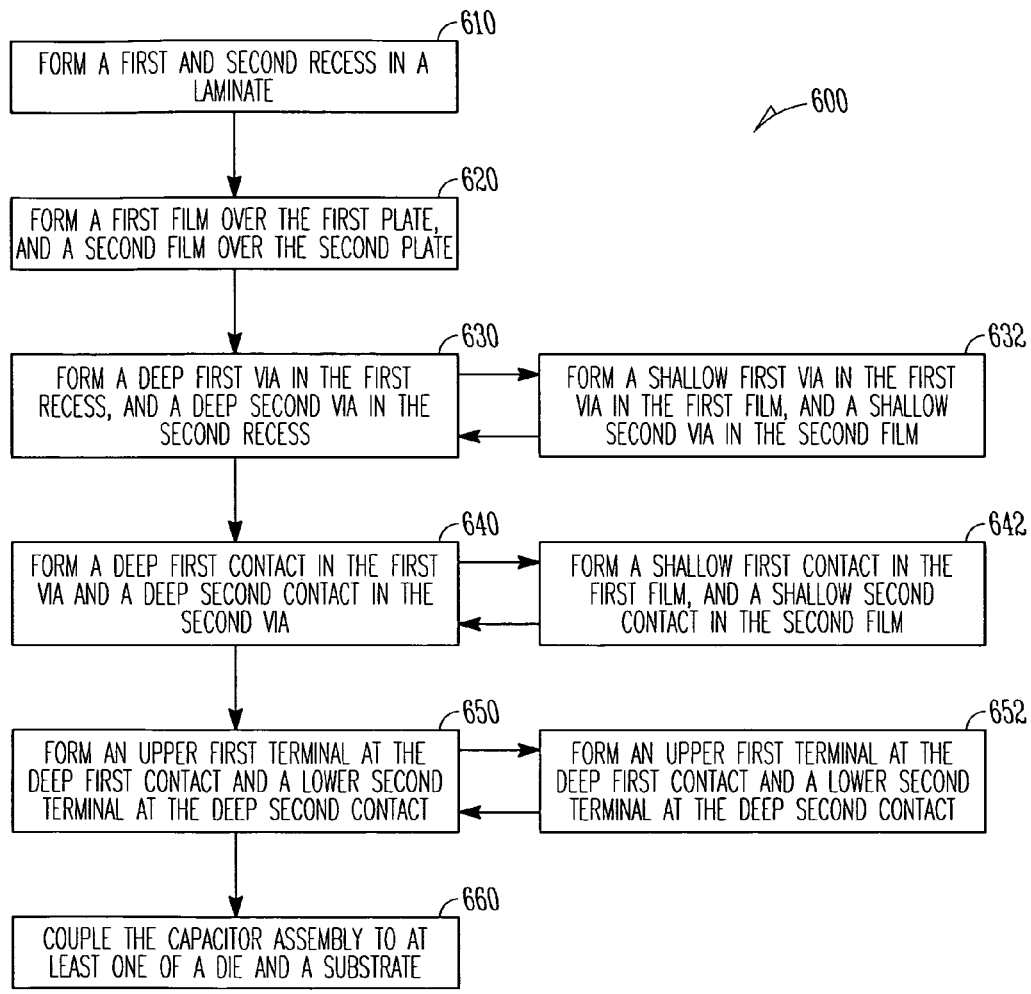
FIG. 6 is a process flow diagram according to various embodiments.

FIG. 6 is a process flow diagram 600 according to various embodiments.

At 610, the process includes forming a first and second recess in a laminate. By way of non-limiting example, the first recess 122 and the second recess 124 are formed in the laminate 110 by a process such as chemical etching, laser drilling, or patterning the plate material upon the dielectric center film 112.

At 620, the process includes forming a first film over the first plate and a second film over the second plate. By way of non-limiting example, the first film 126 and the second film 128 are spun on and cured. By way of non-limiting example, the first film 126 and the second film 128 are spread on as green BST material, and subsequently fired further up the line of the process.

At 630, the process includes forming a deep first via in the first recess, and forming a deep second via in the second recess. By way of non-limiting example, the first film 126 and the second film 128 are not fully cured dielectric materials, and the deep first via 130 and the deep second via 132 are formed by laser drilling. Other methods can be used depending upon the process conditions and the expected duty of the capacitor composite.

At 632, the process alternatively includes forming a shallow first via in the first film and a shallow second via in the second film. By way of non-limiting example, the process includes laser drilling to form both the deep first via 130 and the shallow first via 132. In the case of the deep first via 130, the laser drilling stops on the second plate 120. In the case of the shallow first via 132, the laser drilling stops on the first plate 118. In the case of the deep second via 134, the laser drilling stops on the first plate 118. In the case of the shallow second via 136, the laser drilling stops on the second plate 120. In an embodiment, processes 630 and 632 are carried out substantially simultaneously.

At 640, the process includes forming a deep first contact in the deep first via, and forming a deep second contact in the deep second via. By way of non-limiting example, the deep first contact 138 and the deep second contact 142 are formed by electroplating, by imposing a cathodic character upon the plates 118 and 120.

At 642, the process alternatively includes forming a shallow first contact in the first film, and forming a shallow second contact in the second film. By way of non-limiting example, the shallow first contact 140 and the shallow second contact 144 are formed by electroplating, by imposing a cathodic character upon the plates 118 and 120. In an embodiment, processes 640 and 642 are carried out substantially simultaneously.

At 650, the process includes forming an upper first terminal at the deep first contact, and forming a lower first terminal at the deep second contact. By way of non-limiting example, the upper first terminal 146 is formed at the deep first contact 138, and the lower first terminal 150 is formed at the deep second contact 142.

In an embodiment, the process is completed at 650.

At 652, the process optionally includes forming an upper second terminal at the shallow first contact, and forming a lower second terminal at the shallow second contact. By way of non-limiting example, the upper second terminal 148 is formed at the shallow first contact 140, and the lower second terminal 152 is formed at the shallow second contact 144. In an embodiment, processes 650 and 652 are carried out substantially simultaneously.

In an embodiment, the process is completed at 652.

At 660 the process includes a method of coupling the capacitor assembly to at least one of a substrate, a die, and a subsequent capacitor assembly. By way of non-limiting example, the capacitor assembly 106 (FIG. 1G) is coupled to the substrate 156. In an embodiment, the substrate is the interposer 256. Further by way of non-limiting example, the capacitor assembly 205 (FIG. 2) is coupled to the die 266. Further by way of non-limiting example, the first capacitor assembly 505 (FIG. 5) is coupled to the subsequent capacitor assembly 507.

Figure 7:
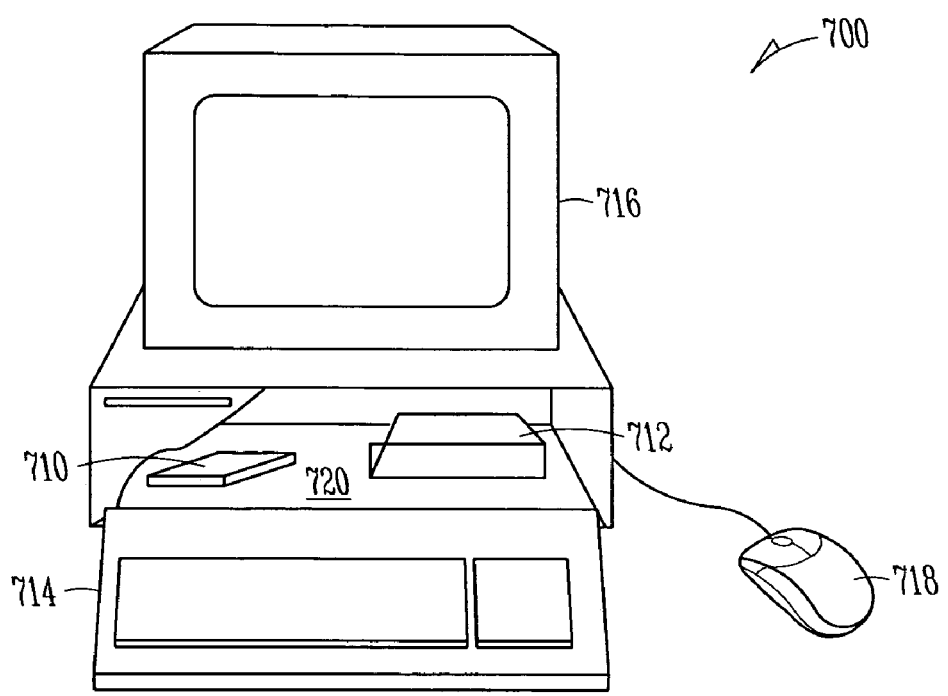
FIG. 7 is a depiction of a computing system according to an embodiment.

FIG. 7 is a depiction of a computing system 700 according to an embodiment. One or more of the foregoing embodiments of a capacitor assembly and/or a capacitor composite may be utilized in a computing system, such as the computing system 700 of FIG. 7. The computing system 700 includes at least one processor, which is enclosed in a package 710 and a data storage system 712 for example, for a data storage device such as dynamic random access memory, polymer memory, flash memory, and phase-change memory. The computing system 700 also includes at least one input device such as a keyboard 714, and at least one output device such as a monitor 716, for example. The computing system 700 includes a processor that processes data signals, and may include, for example, a microprocessor, available from Intel Corporation. In addition to the keyboard 714, the computing system 700 can include another user input device such as a mouse 718, for example.

For purposes of this disclosure, a computing system 700 embodying components in accordance with the claimed subject matter may include any system that utilizes a capacitor assembly and/or a capacitor composite, which may be coupled to a mounting substrate 720. In an embodiment, the capacitor assembly and/or a capacitor composite is in the package 710. In an embodiment, the capacitor assembly and/or a capacitor composite is in the package 710 and is coupled to a die, for example, as depicted in either of FIGS. 2 and 3. The capacitor assembly and/or a capacitor composite can also be coupled to the mounting substrate 720 for a die that contains a digital signal processor (DSP), a micro-controller, an application specific integrated circuit (ASIC), or a microprocessor.

Embodiments set forth in this disclosure can be applied to devices and apparatuses other than a traditional computer. For example, a die can be packaged with an embodiment of the capacitor assembly and/or a capacitor composite and placed in a portable device such as a wireless communicator or a hand-held device such as a personal digital assistant and the like. Another example is a die that can be packaged with a capacitor assembly and/or a capacitor composite and placed in a vehicle such as an automobile, a locomotive, a watercraft, an aircraft, or a spacecraft.

The Abstract is provided to comply with 37 C.F.R. § 1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A capacitor assembly comprising:
   a laminate including a dielectric center film with first and second sides; a first plate on the first side; and a second plate on the second side;
   a first recess in the first plate that exposes the dielectric center film, and a second recess in the second plate that exposes the dielectric center film;
   a first film in the first recess and deep and shallow first vias in the first film, wherein the deep first via exposes the second plate through the first recess, and wherein the shallow first via exposes the first plate from the first side;
   a second film in the second recess and deep and shallow second vias in the second film, wherein the deep second via exposes the first plate in the second recess, and wherein the shallow second via exposes the second plate from the second side; and
   a deep first contact in the deep first via, and a shallow first contact in the shallow first via; a deep second contact in the deep second via, and a shallow second contact in the shallow second via.

2. The capacitor assembly of claim 1, further including:
   an upper first terminal coupled to the first plate by the deep first contact;
   an upper second terminal coupled to the first plate by the shallow first contact;
   a lower first terminal coupled to the second plate by the deep second contact;
   a lower second terminal coupled to the second plate by the shallow second contact.

3. The capacitor assembly of claim 1, further including a substrate coupled to the lower first terminal and the lower second terminal.

4. The capacitor assembly of claim 1, further including:
a substrate coupled to the lower first terminal and the lower second terminal; and
a polymer film between the substrate and the second side.

5. The capacitor assembly of claim 1, further including a die coupled to the upper first terminal and the upper second terminal.

6. The capacitor assembly of claim 1, further including:
a die coupled to the upper first terminal and the upper second terminal; and
an underfill layer between the die and the first side.

7. The capacitor assembly of claim 1, further including:
a substrate coupled to the lower first terminal and the lower second terminal;
a polymer film between the substrate and the second side;
a die coupled to the upper first terminal and the upper second terminal; and
an underfill layer between the die and the first side.

8. A capacitor composite comprising:
a laminate including a dielectric center film with first and second sides; a first plate on the first side; and a second plate on the second side;
a first recess in the first plate that exposes the dielectric center film, and a second recess in the second plate that exposes the dielectric center film, and wherein the first and second recesses are laterally offset;
a first film in the first recess and deep and shallow first vias in the first film, wherein the deep first via exposes the second plate through the first recess, and wherein the shallow first via exposes the first plate from the first side;
a second film in the second recess and deep and shallow second vias in the second film, wherein the deep second via exposes the first plate in the second recess, and wherein the shallow second via exposes the second plate from the second side;
a deep first contact in the deep first via, and a shallow first contact in the shallow first via; a deep second contact in the deep second via, and a shallow second contact in the shallow second via;
an upper first terminal coupled to the first plate by the deep first contact;
an upper second terminal coupled to the first plate by the shallow first contact;
a lower first terminal coupled to the second plate by the deep second contact;
a lower second terminal coupled to the second plate by the shallow second contact; the above structure comprising a capacitor assembly, and
a spacer coupled to the capacitor assembly.

9. The capacitor composite of claim 8, further including an interposer coupled to the capacitor assembly and the spacer.

10. The capacitor composite of claim 8, further including an interposer coupled to the lower first terminal and the lower second terminal.

11. The capacitor composite of claim 8, wherein the capacitor assembly exhibits a first profile above the interposer, and further including a spacer disposed on the interposer that exhibits substantially the first profile.

12. The capacitor composite of claim 8, wherein the capacitor assembly exhibits a first profile above the interposer, wherein the capacitor assembly is embedded in the spacer, and wherein the spacer exhibits a second profile that is larger than the first profile.

13. A computing system comprising:
a laminate including a dielectric center film with first and second sides; a first plate on the first side; and a second plate on the second side;
a first recess in the first plate that exposes the dielectric center film, and a second recess in the second plate that exposes the dielectric center film;
a first film in the first recess and deep and shallow first vias in the first film, wherein the deep first via exposes the second plate through the first recess, and wherein the shallow first via exposes the first plate from the first side;
a second film in the second recess and deep and shallow second vias in the second film, wherein the deep second via exposes the first plate in the second recess, and wherein the shallow second via exposes the second plate from the second side;
a deep first contact in the deep first via, and a shallow first contact in the shallow first via; a deep second contact in the deep second via, and a shallow second contact in the shallow second via;
an upper first terminal coupled to the first plate by the deep first contact;
an upper second terminal coupled to the first plate by the shallow first contact;
a die coupled to the upper first terminal;
a lower first terminal coupled to the second plate by the deep second contact;
a lower second terminal coupled to the second plate by the shallow second contact;
at least one of an input device and an output device coupled to the die; and
a dynamic random access storage device coupled to the die.

14. The computing system of claim 13, wherein the system is disposed in one of a computer, a wireless communicator, a hand-held device, an automobile, a locomotive, an aircraft, a watercraft, and a spacecraft.

15. The computing system of claim 13, wherein the die is selected from a data storage device, a digital signal processor, a micro controller, an application specific integrated circuit, and a microprocessor.

* * * * *